US010453520B2

(12) United States Patent
Ishii

(10) Patent No.: US 10,453,520 B2
(45) Date of Patent: *Oct. 22, 2019

(54) MULTI-PORT MEMORY AND SEMICONDUCTOR DEVICE

(71) Applicant: Renesas Electronics Corporation, Tokyo (JP)

(72) Inventor: Yuichiro Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/013,514

(22) Filed: Jun. 20, 2018

(65) Prior Publication Data

US 2018/0301184 A1    Oct. 18, 2018

Related U.S. Application Data

(63) Continuation of application No. 15/674,659, filed on Aug. 11, 2017, now Pat. No. 10,026,472.

(30) Foreign Application Priority Data

Oct. 28, 2016 (JP) ................................ 2016-211731

(51) Int. Cl.
| G11C 11/00 | (2006.01) |
| G11C 11/418 | (2006.01) |
| G11C 11/419 | (2006.01) |
| G11C 7/10 | (2006.01) |

(Continued)

(52) U.S. Cl.
CPC .......... *G11C 11/418* (2013.01); *G11C 7/1018* (2013.01); *G11C 7/1075* (2013.01);
(Continued)

(58) Field of Classification Search
CPC ............................ G11C 11/418; G11C 11/19
(Continued)

(56) References Cited

U.S. PATENT DOCUMENTS 7,643,330 B1   1/2010 Lin et al.
9,230,622 B2 *   1/2016 Wu ...................... G11C 7/1039
(Continued)

OTHER PUBLICATIONS

United States Notice of Allowance dated Mar. 26, 2018 in U.S. Appl. No. 15/674,659.
(Continued)

*Primary Examiner* — Connie C Yoha
(74) *Attorney, Agent, or Firm* — McGinn IP Law Group, PLLC

(57) ABSTRACT

A memory circuit includes: a control circuit generating first and second start signals within a single signal cycle of an input clock signal; an address control circuit coupled to a plurality of address ports for receiving a plurality of address signals and activating one of word lines corresponding to one of the address signals based on the first or second start signals; and a data input/output circuit for writing or reading data by selecting one of memory cells coupled to the activated word line. The control circuit includes: a start signal generation unit that generates the first start signal in response to a first pulse signal and the second start signal in response to a second pulse signal, and a pulse signal generation unit that generates the first pulse signal in response to the input clock signal and the second signal in response to the first start signal.

8 Claims, 11 Drawing Sheets

(51) Int. Cl.
*G11C 8/16* (2006.01)
*G11C 11/412* (2006.01)
(52) U.S. Cl.
CPC .............. *G11C 8/16* (2013.01); *G11C 11/412* (2013.01); *G11C 11/419* (2013.01)
(58) Field of Classification Search
USPC ............... 365/154, 194, 230.05, 230.08, 233
See application file for complete search history.

(56) References Cited

U.S. PATENT DOCUMENTS

| | | | | |
|---|---|---|---|---|
| 9,922,703 | B2* | 3/2018 | Ishii | G11C 7/00 |
| 10,026,472 | B2* | 7/2018 | Ishii | G11C 7/1018 |
| 10,032,506 | B2* | 7/2018 | Rawat | G11C 11/419 |
| 2008/0181022 | A1 | 7/2008 | Fujisawa et al. | |
| 2008/0192563 | A1 | 8/2008 | Cho | |
| 2010/0332929 | A1* | 12/2010 | Branch | G01R 31/318536 714/731 |
| 2012/0112810 | A1 | 5/2012 | Wang et al. | |
| 2013/0111253 | A1* | 5/2013 | Lewis | G11C 7/1075 713/400 |

OTHER PUBLICATIONS

United States Supplemental Notice of Allowance dated Apr. 11, 2018 in U.S. Appl. No. 15/674,659.

* cited by examiner

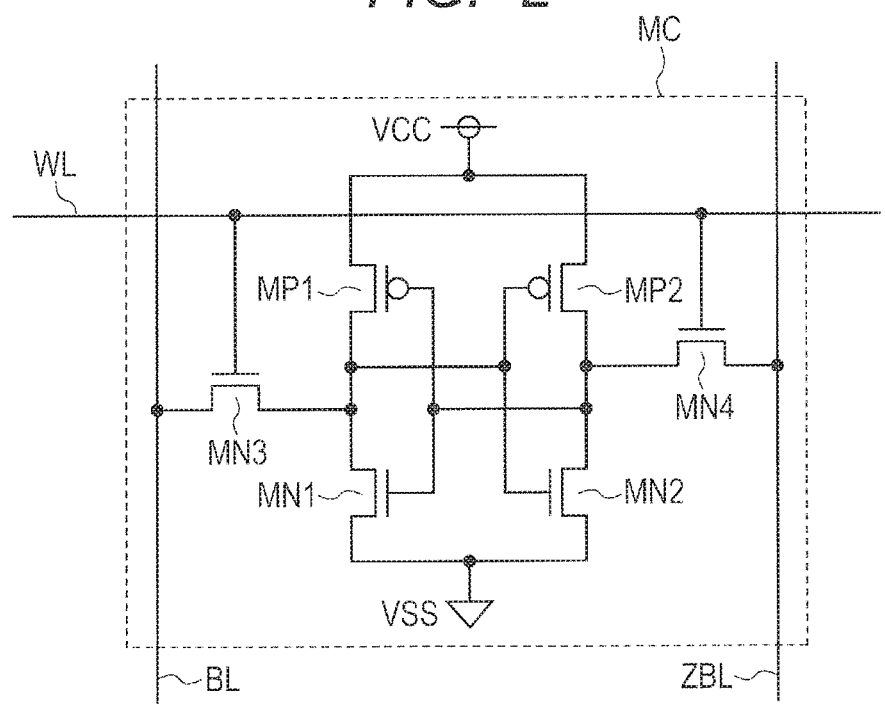
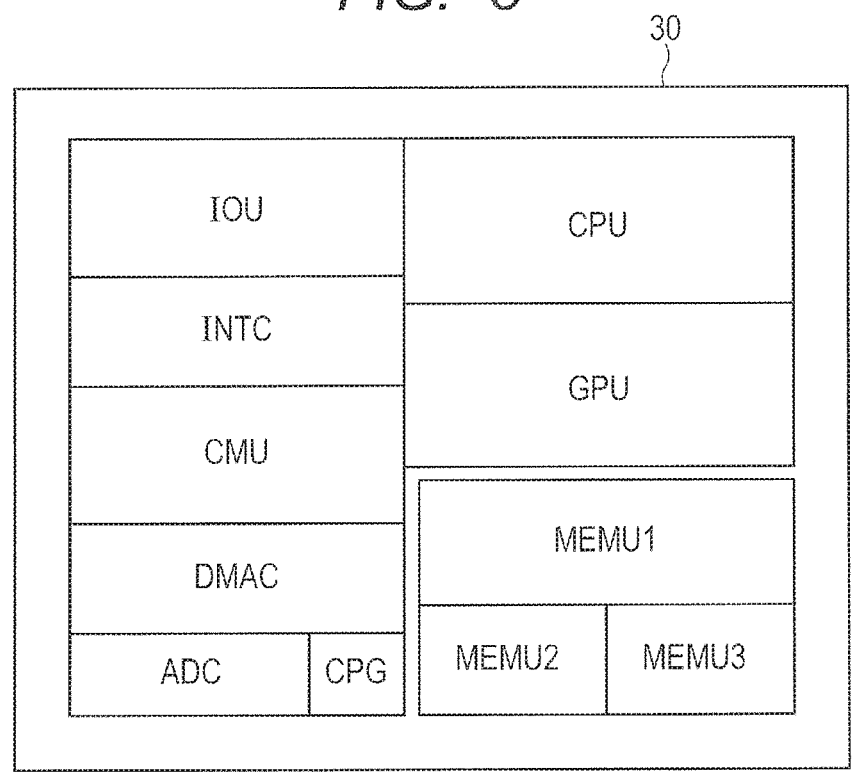

MULTI-PORT MEMORY AND SEMICONDUCTOR DEVICE

CROSS-REFERENCE TO RELATED APPLICATIONS

The present application is a Continuation Application of U.S. patent application Ser. No. 15/674,659, filed on Aug. 11, 2017, which is based on Japanese Patent Application No. 2016-211731 filed on Oct. 28, 2016 including the specification, drawings and abstract is incorporated herein by reference in its entirety.

BACKGROUND

The disclosure is directed to a multi-port memory, and more specifically, to a technology to allow a memory to function as a pseudo multi-port memory.

Pseudo two-port static random access memory (SRAM) is a technology that realizes the function of a pseudo two-port SRAM by using a memory macro of a single-port SRAM, which is widely used in the field of image processing field. The internal circuit of the pseudo two-port SRAM is configured to operate twice during one cycle of an external clock.

U.S. Pat. No. 7,643,330 (Patent Document 1) discloses a pseudo two-port SRAM that performs a read operation in synchronization with the rising edge of an external clock and performs a write operation in synchronization with the falling edge of the external clock.

SUMMARY

However, the pseudo two-port SRAM described in the above document performs the operation in synchronization with the rising and falling edges of the external clock, and this makes it difficult to increase the clock frequency. As an example, it is assumed that a pseudo two-port SRAM has an external clock with a duty cycle of 50%, requiring 0.5 nsec for a read operation and 1.0 nsec for a write operation. In this case, it takes as much as 1.0 nsec to perform a read operation because the pseudo two-port SRAM is limited by the slower operation.

The present disclosure has been made to solve the above problem. In an aspect, an object of this invention is to provide a multi-port memory that can operate faster than the conventional one. In another aspect, an object of this invention is to provide a semiconductor device that can operate faster than the conventional one.

Other objects and novel features will become apparent from the description and the accompanying drawings.

A multi-port memory according to an embodiment includes: a memory array including a plurality of memory cells and a plurality of word lines; a control circuit for generating a start signal based on an input clock signal; an address control circuit including a plurality of ports, to activate one of the word lines by decoding one of a plurality of address signals input from the ports, at the timing corresponding to the start signal; and a data input/output circuit for writing or reading data by selecting one of the memory cells coupled to the activated word line, based on an output from the address control circuit. The control circuit includes: a pulse signal generation unit that generates a pulse signal; a start signal generation unit that generates a start signal in response to an output of the pulse signal generation unit; and a delay circuit that generates a delay signal to delay the start signal. The pulse signal generation unit includes a first pulse signal generator circuit that generates a first pulse signal in response to the input of the cock signal. The start signal generation unit includes a first latch circuit that sets the first start signal to a first state and holds this state in response to generation of a first pulse signal, and then resets the first start signal to a second state in response to a first delayed signal that is obtained by delaying the first start signal by the delay circuit. The pulse signal generation unit further includes a second pulse signal generator circuit that generates a second pulse signal in response to the input of the first delayed signal. The first latch circuit sets the second start signal to the first state and holds this state in response to generation of the second pulse signal, and then resets the second start signal to the second state in response to a second delayed signal that is obtained by delaying the second start signal by the delay circuit.

A multi-port memory according to an embodiment can operate faster than the conventional one.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram showing a configuration example of a memory cell;

FIG. 3 is a diagram schematically showing a layout configuration example of a semiconductor device;

DETAILED DESCRIPTION

Figure 1:
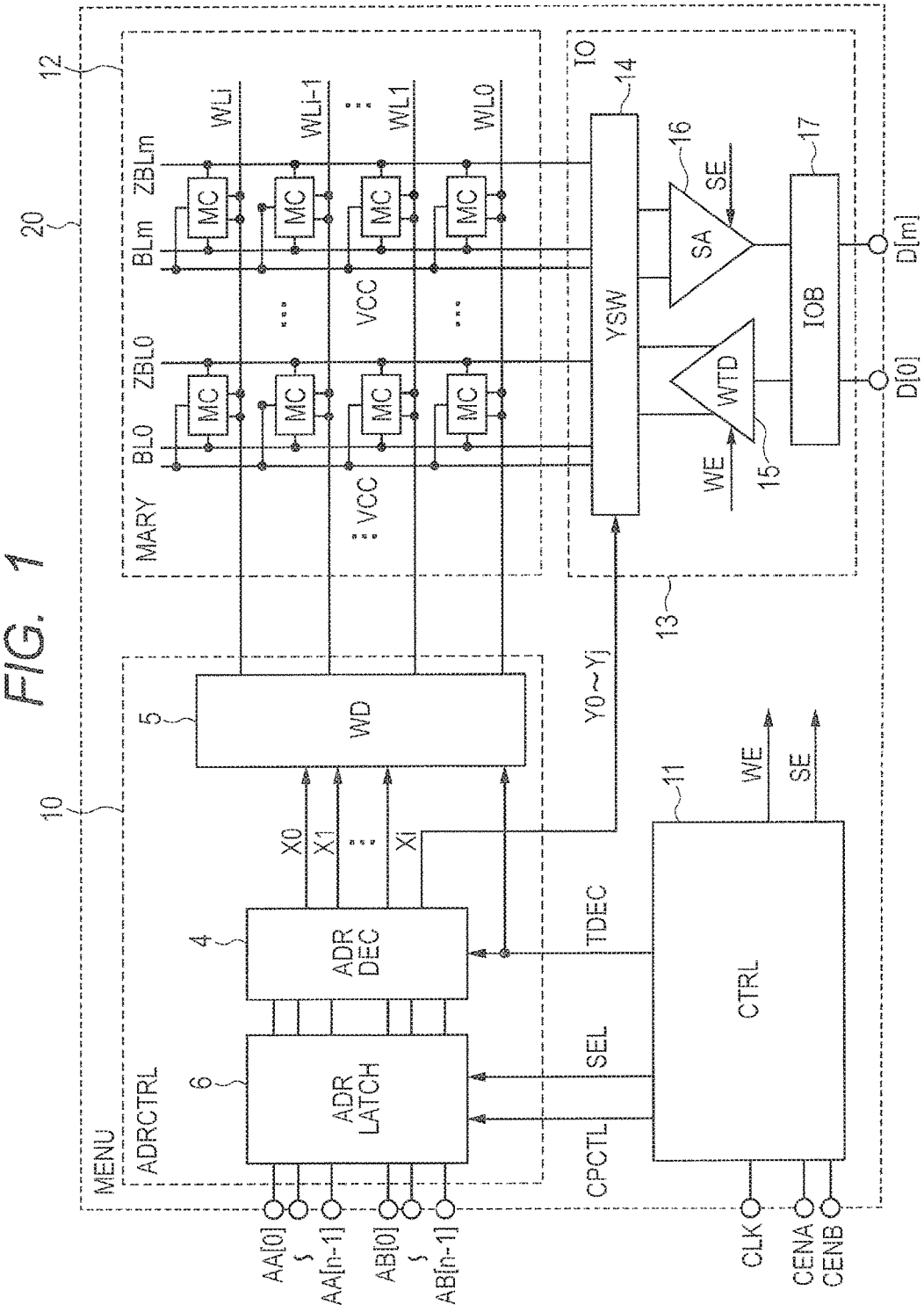
FIG. 1 is a block diagram showing a configuration example of a memory unit.

Hereinafter, embodiments of the present invention will be described in detail with reference to the accompanying drawings. In the following description, like parts are designated by like reference numerals, whose names and functions are also the same. Thus, the detailed description thereof will not be repeated.

First Embodiment (Configuration of Memory Unit 20)

FIG. 1 is a block diagram showing a configuration example of a pseudo two-port SRAM (MEMU 20). A memory unit 20 of the pseudo two-port SRAM is provided with an address control circuit (ADRCTRL) 10, a control circuit (CTRL) 11, a memory array (MARY) 12, and a data input/output circuit (IO) 13.

The address control circuit 10 has two ports (A port and B port). The address control circuit 10 activates one of a plurality of word lines by decoding one of a plurality of address signals input from the ports, at the timing corresponding to the start signal described below. Thus, the address control circuit 10 is provided with an address latch circuit (ADRLATCH) 6, a decode circuit (ADRDEC) 4, and a word line driving circuit (WD) 5. An address signal AA [n−1:0] of the A port as well as an address signal AB [n−1:0] of the B port are input to the address latch circuit 6. The notation "[n−1:0]" means a digital signal line of a plurality of bits, which represents a signal line of n bits (n lines) from n−1 to 0 bits. Based on control signals CPCTL, SEL, and CPA supplied from the control circuit 11, the address latch circuit 6 selects the address signals AA and AB, sequentially, and outputs to the decode circuit 4.

The decode circuit 4 decodes the input address. Then, the decode circuit 4 outputs a row selection control signal of X0 to Xi, to the word line driving circuit 5, and outputs a column selection control signal of Y0 to Yj to a column selection circuit (YSW) 14. The decode circuit 4 outputs the decoded selection control signal to the column selection circuit 14 at a timing corresponding to a start signal TDEC output from the control circuit 11. The word line driving circuit 5 drives (activates) one of the words lines in response to the input selection control signal X0 to Xi.

The control circuit 11 generates various signals including the control signals CPCTL, SEL, WE, SE and the start signal TDEC, based on the clock signal CLK and chip enable signals CENA and CENB, which are input from the outside. The method of generating the start signal TDEC will be described below with reference to FIG. 4. The control circuit 11 outputs the generated control signals CPCTL and SEL as well as the generated start signal TDEC to the address control circuit 10. Then, the control circuit 11 outputs the control signals WE and SE to the data input/output circuit 13.

The memory array 12 includes: i+1 word lines WL0 to WLi extending in the row direction; m+1 bit line pairs BL0/ZBL0 to BLm/ZBLm extending in the column direction that intersects the row direction; and a plurality of memory cells MC (i and m are an integer greater than 1). Each bit line pair is configured with two bit lines (for example, BL0 and ZBL0) for transmitting complimentary signals. Each memory cell MC is coupled to one word line and one bit line pair. A plurality of memory cells arranged along the same row are coupled to a common word line. A plurality of memory cells arranged along the same column are coupled to a common pair of bit lines. A specific configuration example of the memory cell MC will be described below with reference to FIG. 2.

The data input/output circuit 13 performs data writing or reading by selecting one of the memory cells coupled to the word line that is activated by the address control circuit 10. The data input/output circuit 13 includes a column selection circuit (YSW) 14, a write driving circuit (WTD) 15, a sense amplifier (SA) 16, and an input/output buffer (IOB) 17. The input/output buffer 17 temporarily holds the data input from the outside as data to be written, as well as the data read from the memory array 12. The write driving circuit 15 outputs the data, which is held in the input/output buffer 17 as data to be written, to the column selection circuit 14 in response to the control signal (write enable signal) WE. The column selection circuit 14 drives the bit line pair in response to the input selection control signal of Y0 to Yj, and writes the data to the target memory cell. The sense amplifier 16 reads the data of the memory cell selected by the column selection circuit 14 in response to the control signal (sense enable signal) SE, and outputs to the input/output buffer 17.

(Configuration of Memory Cell MC)

FIG. 2 is a diagram showing a configuration example of the memory cell MC. In the example shown in FIG. 2, each memory cell MC is a single-port SRAM memory cell.

The memory cell MC is provided with four N-channel metal oxide semiconductor (MOS) transistors MN1 to MN4 and two P-channel MOS transistors MP1 and MP2. The transistor MN3 is configured such that the gate is coupled to the word line WL and either the source or the drain is coupled to the bit line BL. The transistor MN4 is configured such that the gate is coupled to the word line WL and either the source or the drain is coupled to the bit line ZBL. The transistors MN1 and MP1 configures a complementary metal oxide semiconductor (CMOS) inverter circuit between a power supply voltage VCC and a ground voltage VSS. Similarly, the transistors MN2 and MP2 also configure a CMOS inverter circuit between the power supply voltage VCC and the ground voltage VSS. The two CMOS inverter circuits configure a latch circuit in such a way that one input is coupled to the other output. The latch circuit is configured to be able to store information of one bit.

The source of the transistor MN4 and the other drain are coupled to the input of the CMOS inverter circuit configured with the transistors MN1 and MP1. The source of the transistor MN3 and the other drain are coupled to the input of the CMOS inverter circuit configured with the transistors MN2 and MP2.

(Configuration of Semiconductor Device 30)

FIG. 3 is a diagram schematically showing a layout configuration example of a semiconductor (LSI: Large Scale Integration circuit) device 30. In the example shown in FIG. 3, the semiconductor device 30 is an LSI in which various logic circuits and memory circuits are formed within a single semiconductor chip. The semiconductor device 30 is sometimes referred to as MCU (Micro Controller Unit), MPU (Micro Processor Unit), or SOC (System On a Chip). In an aspect, the semiconductor device 30 can be formed over a single semiconductor substrate, such as silicon, by known manufacturing technique of CMOSLSI. In an aspect, the semiconductor device 30 can be an LSI for automobile use.

In the example shown in FIG. 3, the semiconductor device 30 includes a central processing unit (CPU), a graphics processing unit (GPU), an input/output unit (IOU), an interrupt controller (INTC), and memory units (MEMU) 1 to 3. The CPU controls the operation of the semiconductor device. The GPU performs processing required for image processing. The input/output unit can be an interface for performing input and output of data between the semiconductor device 30 and an external device. The interrupt controller is capable of generating an interrupt signal and outputting to the CPU, in response to an interrupt processing request from a peripheral device (for example, an external device coupled to the input/output unit).

The semiconductor device 30 is also provided with a communication unit (CMU), a direct memory access controller (DMAC) unit, an analog to digital convertor (ADC)

unit, and a clock pulse generator (CPG) circuit. In an aspect, the communication unit can be a communication interface for performing communication with the external device. The direct memory access controller unit controls direct memory access (DAM) transfer to exchange data without the need to pass through the CPU. The analog to digital convertor unit converts an input analog signal to a digital signal, and outputs the converted digital signal to the CPU or other components. The clock pulse generator circuit generates a clock signal by causing the internal oscillator of crystal or ceramic to oscillate, and outputs the generated clock signal to the memory unit or other components.

The memory units (MEMU) 1 to 3 can be configured in the same manner as the memory unit 20 described above. The memory units 1 to 3 are memory macros that can be generated by an automated design tool, such as a memory compiler, by using design data such as memory intellectual property (IP).

The memory unit 20 functions as a pseudo two-port memory by performing both read and write operations in one cycle of the clock signal CLK input from the clock pulse generator circuit. The control circuit 11 of the memory unit 20 generates the internal clock twice during one cycle of the external clock in order to perform the operation (read operation and write operation) twice within one cycle of the external clock. Next, with reference to FIG. 4, a description will be given of the configuration of an internal clock pulse generator circuit for generating the internal clock.

(Configuration and Operation of Internal Clock Pulse Generator Circuit 400)

Figure 4:
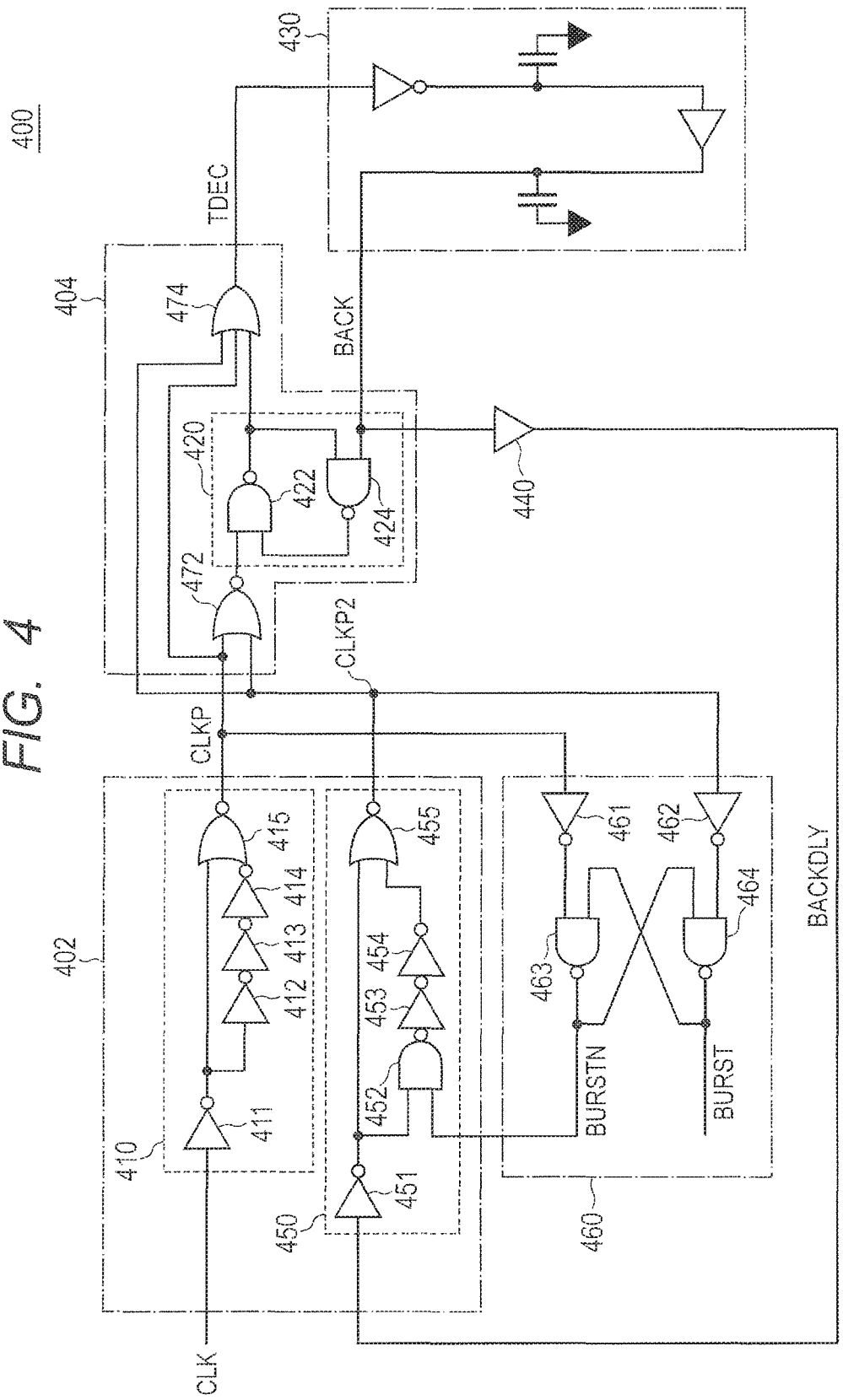
FIG. 4 is a diagram showing a configuration example of an internal clock pulse generator circuit.

FIG. 4 is a diagram showing a configuration example of the internal clock pulse generator circuit 400. In an embodiment, the internal clock pulse generator circuit 400 can be integrated into the control circuit 11.

The internal clock pulse generator circuit 400 includes, as main components, a pulse signal generation unit 402 for generating a pulse signal, a start signal generation unit 404 for generating a start signal in response to an output of the pulse signal generation unit 402, and a first delay circuit 430 for generating a delay signal by delaying the start signal.

The pulse signal generation unit 402 includes a first pulse signal generator circuit 410 for generating a first pulse signal, as well as a second pulse signal generator circuit 450 for generating a second pulse signal. The start signal generation unit 404 includes a first latch circuit 420. The internal clock pulse generator circuit 400 further includes a second latch circuit 460.

The first pulse signal generator circuit 410 generates a first pulse signal CLKP, and outputs the generated first pulse signal CLKP to the start signal generation unit 404 and the second latch circuit 460. The start signal generation unit 404 generates a start signal TDEC, and outputs the generated start signal TDEC to the first delay circuit 430. The first delay circuit 430 generates a feedback signal BACK by delaying the start signal TDEC, and outputs the generated feedback signal BACK to the start signal generation unit 404 and the second pulse signal generator circuit 450. The second pulse signal generator circuit 450 generates a second pulse signal CLKP2, and outputs the generated second pulse signal CLKP2 to the start signal generation unit 404 and the second latch circuit 460. The second latch circuit 460 outputs a control signal BURSTN to the second pulse signal generator circuit 450. Hereinafter, the operation of the internal clock pulse generator circuit 400 will be described in detail with reference to FIGS. 4 and 5.

Figure 5:
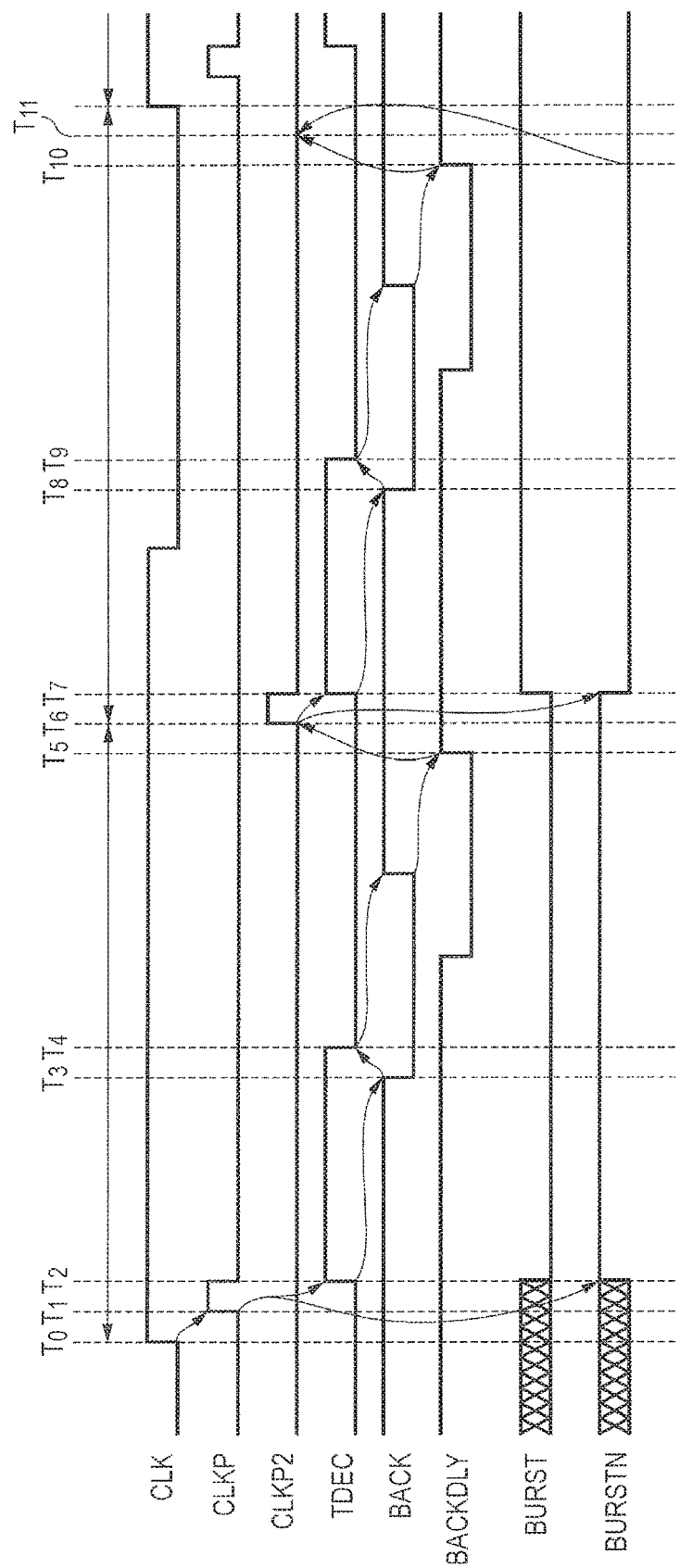
FIG. 5 is a timing chart showing the operation of the respective circuits included in the internal clock pulse generator circuit shown in FIG. 4.

FIG. 5 is a timing chart showing the operation of the respective circuits included in the internal clock pulse generator circuit 400 according to an embodiment.

At time T0, the clock signal CLK, which is output from the clock pulse generator circuit, transitions from "Low" level to "High" level. Along with this change, the first pulse signal generator circuit 410 outputs the first pulse signal CLKP at time T1. More specifically, in the first pulse signal generator circuit 410, the clock signal CLK input from the clock generator circuit is inverted by an inverter 411 and the inverted signal is input to an end of the NOR gate 415. Further, in the first pulse signal generator circuit 410, the inverted signal is further inverted by odd-number inverters 412, 413, 414, and the resultant signal is input to the other end of the NOR gate 415. In this way, the NOR gate 415 outputs the first pulse signal CLKP which is held at "High" level during the delay time by the odd-number inverters 412, 413, and 414. The first pulse signal CLKP is input to the first latch circuit 420 through a NOR gate 472. Further, the first pulse signal CLKP is also input to an OR gate 474.

At time T2, along with generation of the first pulse signal CLKP, the start signal TDEC output from the OR gate 474 transitions from "Low" level to "High" level. At the same time, the first latch circuit 420 sets the start signal TDEC to "High" level by the first pulse signal CLKP input through the NOR gate 472, and keeps the start signal TDEC at "High" level.

The OR gate 474 accepts the input of the first pulse signal CLKP without the need to pass through the first latch circuit 420. For this reason, the internal clock pulse generator circuit 400 can allow the start signal TDEC to transition to "High" level at a timing earlier than when the first latch circuit 420 sets the start signal TDEC to "High" level.

Note that, in another aspect, it may also be possible to configure the internal clock pulse generator circuit without having the path through which the first pulse signal CLKP is directly input to the OR gate 474. In such a case, the timing at which the start signal TDEC transitions to "High" level is dependent on the timing at which the first latch circuit 420 sets the start signal TDEC to "High" level.

The first pulse signal CLKP is also input to the second latch circuit 460. In the example shown in FIG. 4, the second latch circuit 460 includes two inverters 461 and 462, as well as a reset-set latch circuit configured with two NAND gates 463 and 464. At time T2, in response to the input of the first pulse signal to the invertor 461, the second latch circuit 460 sets the control signal BURSTN to be output to the second pulse signal generator circuit 450, to "High" level. Then, the second latch circuit 460 keeps the control signal BURSTN at "High" level.

The first delay circuit 430 delays the start signal TDEC input from the start signal generation unit 404, and outputs the inverted feedback signal BACK. The first delay circuit 430 is configured, as an example, with an odd number inverter and a replica bit line that represents the bit line capacity.

At time T3, in response to the transition of the start signal TDEC to "High" level, the feedback signal BACK output from the first delay circuit 430 transitions from "High" level to "Low" level.

At time T4, when the feedback signal BACK that transitions to "Low" level is input to a NAND gate 424, the first latch circuit 420 resets the start signal TDEC to "Low" level. In this way, the first latch circuit 420 sets a first time start signal TDEC to "High" level and holds this state during the delay time (time T2 to T4) determined by the first delay circuit 430. The delay time is designed to correspond to the time when a pair of bit lines changes in amplitude to the potential difference required for data reading by the sense amplifier. The feedback signal BACK transitions to "High" level after the delay time determined by the first delay circuit 430 has elapsed from when the start signal TDEC was reset to "Low" level.

The second delay circuit 440 generates a delayed feedback signal BACKDLY obtained by delaying the feedback signal BACK, and outputs to the second pulse signal generator circuit 450.

At time T5, in response to the transition of the feedback signal to "High" level, the delayed feedback signal BACKDLY transitions to "High" level.

The second pulse signal generator circuit 450 includes inverters 451, 453, 454, a NAND gate 452, and a NOR gate 455. The inverter 451 inverts the delayed feedback signal BACKDLY, and outputs the inverted signal to an end of the NAND gate 452 and to an end of the NOR gate 455. The control signal BURSTN is input to the other end of the NAND gate 452. The output of the NAND gate 452 is input to the other end of the NOR gate 455 through the inverters 453 and 454.

At time T6, in a state of accepting the input of the control signal BURSTN that is set to "High" level, the second pulse signal generator circuit 450 generates a second pulse signal CLKP2 in response to the transition of the delayed feedback signal BACKDLY to "High" level. More specifically, the second pulse signal generator circuit 450 inputs a signal of "Low" level, which is inverted by the inverter 451, to an end of the NOR gate 455. At the same time, the second pulse signal generator circuit 450 inputs the inverted signal of "Low" level to an end of the NAND gate 452. Then, in a state of accepting the input of the control signal BURSTN that is set to "High" level, the NAND gate 452 outputs a signal of "High" level. As a result, a delayed signal obtained by inverting the output signal of the inverter 451 is input to the other end of the NOR gate 455. Thus, the NOR gate 455 generates the second pulse signal CLKP2 that is held at "High" level during the delay time (T6 to T7) by the NAND gate 452, the inverter 453, and the inverter 454. The generated second pulse signal CLKP2 is input to the start signal generation unit 404 and the second latch circuit 460.

At time T7, when the second time pulse signal CLKP is input to the inverter 462, the second latch circuit 460 resets the control signal BURSTN, which is output to the second pulse signal generator circuit 450, to "Low" level.

Further, at time T7, in response to the input of the second pulse signal CLKP2, the first latch circuit 420 sets a second time start signal TDEC to "High" level again.

At time T8, in response to the transition of the second start signal TDEC to "High" level, a second time feedback signal BACK transitions to "Low" level.

At time T9, the feedback signal BACK that has transitioned to "Low" level is input to the NAND gate 424. In response to this, the first latch circuit 420 resets the start signal TDEC to "Low" level. In this way, the first latch circuit 420 sets the second time start signal TDEC to "High" level and holds this state during the delay time (time T7 to T9) determined by the first delay circuit 430. The second time feedback signal BACK transitions to "High" level after the delay time determined by the first delay circuit 430 has elapsed from when the second time start signal TDEC was reset to "Low" level.

At time T10, in response to the transition of the delayed feedback signal BACKDLY to "High" level, the delayed feedback signal BACKDLY transitions to "High" level again.

At time T11, in response to the transition of the delayed feedback signal BACKDLY to "High" level, the second pulse signal generator circuit 450 does not generate the second pulse signal CLKP2. The reason of this is that the control signal BURSTN is reset to "Low" level at time T11. More specifically, in a state of accepting the input of the reset control signal BURSTN, the NAND gate 452 constantly outputs a signal of "High" level. For this reason, in a state where the control signal BURTN is reset, a signal of "High" level is constantly input to an end of the NOR gate 455 through the inverter 454. In this case, the NOR gate 455 does not generate the second pulse signal CLKP2 regardless of the level of the delayed feedback signal BACKDLY.

The internal clock pulse generator circuit 400 generates two start signals TDEC during one cycle of the clock signal CLK, and outputs to the decode circuit 4. At the timing corresponding to the input start signal TDEC, the decode circuit 4 decodes the address signal input from the address latch circuit 6 into a selection control signal, and outputs the selection control signal to the column selection circuit 14. The word line driving circuit 5 drives (activates) one of a plurality of word lines in response to an input selection control signal of X0 to Xi.

According to the above description, the internal clock pulse generator circuit 400 can generate the second time start signal TDEC without using the failing edge (negative edge) of the clock signal generated by the clock pulse generator circuit. Further, in conjunction with the timing of completion of the operation corresponding to either the A or B port (for example, the time T4 when the first time start signal TDEC is reset), the internal clock pulse generator circuit 400 can generate the second time start signal TDEC for controlling the operation corresponding to the other port. Thus, for example, if it takes 1 nsec for a read operation and 0.5 nesc for a write operation in the data input/output circuit 13, the internal clock pulse generator circuit 400 can set one cycle of the clock signal CLK to approximately 1.5 nsec. In this way, the internal clock pulse generator circuit 400 can set the frequency with which the start signal TDEC is generated, namely, the operation frequency of the memory unit 20 to a level higher than the conventional level.

Further, in general, the operation speed of the memory unit 20 varies depending on the manufacturing process and the operation environment (for example, temperature). In this regard, the internal clock pulse generator circuit 400 generates the second time start signal TDEC to follow the timing of the completion of the operation corresponding to either A or B port. Thus, it is possible to generate the second time start signal TDEC according to the variation of the operation speed of the memory unit 20. For this reason, the internal clock pulse generator circuit 400 does not need to generate the second time start signal TDEC according to the expected minimum operation speed. As a result, the internal clock pulse generator circuit 400 can set the operation frequency of the memory unit 20 to a level higher than the conventional level.

Further, by the operation of the second latch circuit 460, the pulse signal generation unit 402 does not generate a third time pulse signal (second time second pulse signal CLKP2) in one cycle of the clock signal CLK. In this way, the internal clock pulse generator circuit 400 can prevent unwanted operation that performs again the operation corresponding to the A or B port that has been already performed. As a result, the memory unit 20 can reduce the power consumption for performing unwanted operation.

Further, the memory unit 20 is operated in response to the start signal TDEC generated by the internal clock pulse generator circuit 400. Thus, the clock pulse generator circuit can reduce the clock frequency. As a result, the semiconductor device 30 can reduce the power consumption of the clock pulse generator circuit. In addition, the semiconductor device 30 can also reduce the clock jitter (fluctuations) that can be generated in the clock pulse generator circuit.

Further, the semiconductor device 30 has the advantage of not requiring a power on reset signal immediately after the power is turned on, because the second latch circuit 460 is reliably initialized by the first pulse signal CLKP at time T2, regardless of the state of the second latch circuit 460 immediately after the power is turned on.

(Configuration and Operation of Address Control Circuit 10)

Next, a description will be given of the address control circuit 10 that operates using the start signal TDEC that is generated by the internal clock pulse generator circuit 400 as described above.

Figure 6:
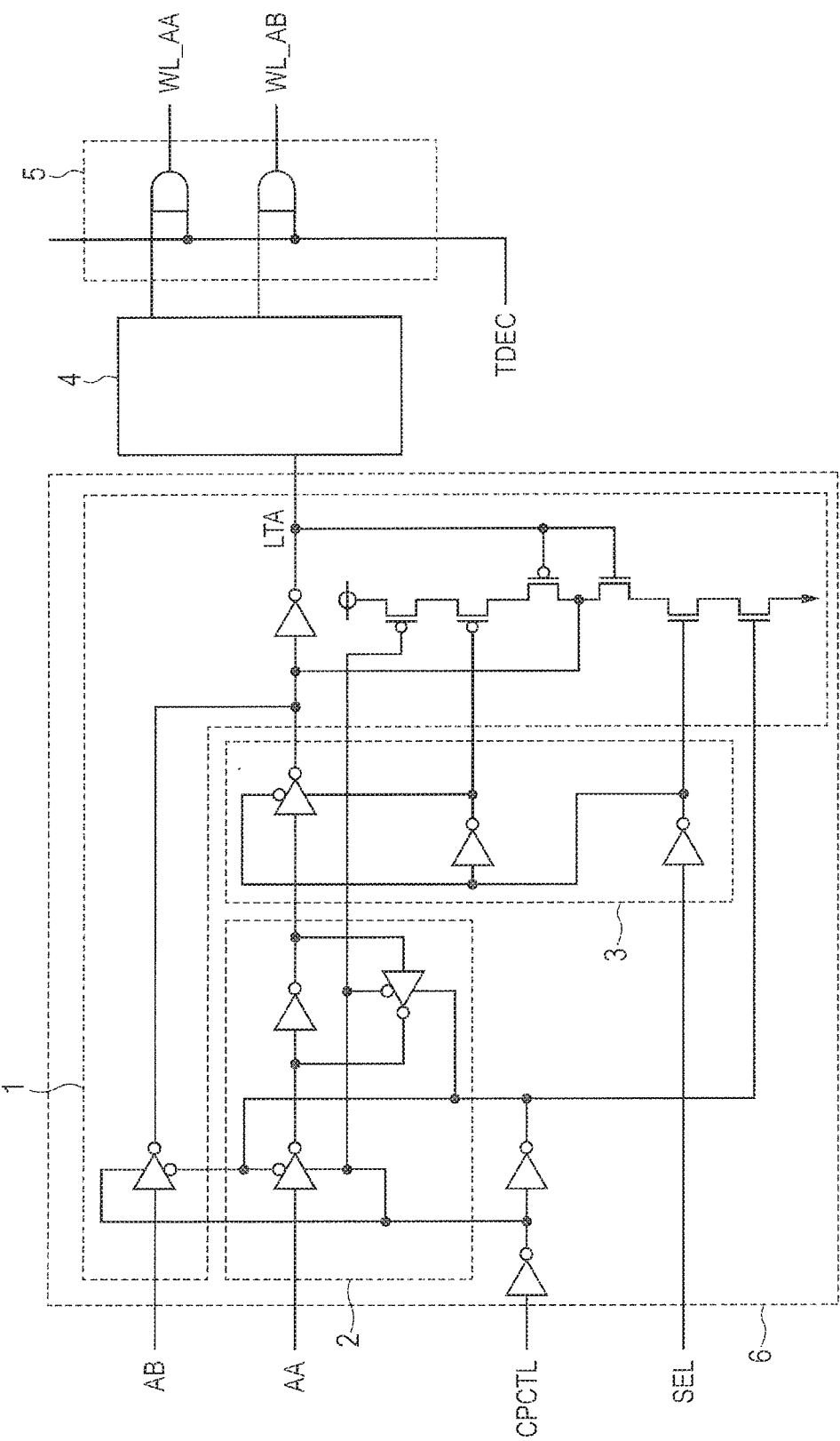
FIG. 6 is a circuit diagram showing a configuration example of an address control circuit.

FIG. 6 is a circuit diagram showing a configuration example of the address control circuit 10. The address control circuit 10 is provided with the address latch circuit 6, the decode circuit 4, and the word line driving circuit 5. The address latch circuit 6 includes the address latch circuit 1, the address latch circuit 2, and a transfer circuit 3.

The address control circuit 10 inputs address signals AA and AB of two systems from the two ports (A port and B port). Then, the address control circuit 10 activates words lines WL_AA and WL_AB corresponding to the respective address signals. Note that in the example shown in FIG. 6, only the circuit for one bit is shown for each of the address signals AA and AB, although the address signals AA and AB are configuration with a plurality of bits.

The address latch circuits 1 and 2 respectively latch the address signals AA and AB, in synchronization with the address latch control signal CPCTL input from the control circuit 11.

The transfer circuit 3 can be configured with one clocked inverter and two inverters as shown in FIG. 6. The transfer circuit 3 supplies the address signal AA to the address latch circuit 1 based on the selection signal SEL input from the control circuit 11.

At the timing corresponding to the start signal TDEC input from the control circuit 11, the decode circuit 4 decodes the input internal address signal LTA and selects one of the word lines. At the timing corresponding to the start signal TDEC input from the control circuit 11, the word line driving circuit 5 drives the word line selected by the decode circuit 4. Note that, in another aspect, the control circuit 11 can input a signal obtained by slightly delaying the start signal TDEC, instead of the start signal TDEC, to the word line driving circuit 5.

Figure 7:
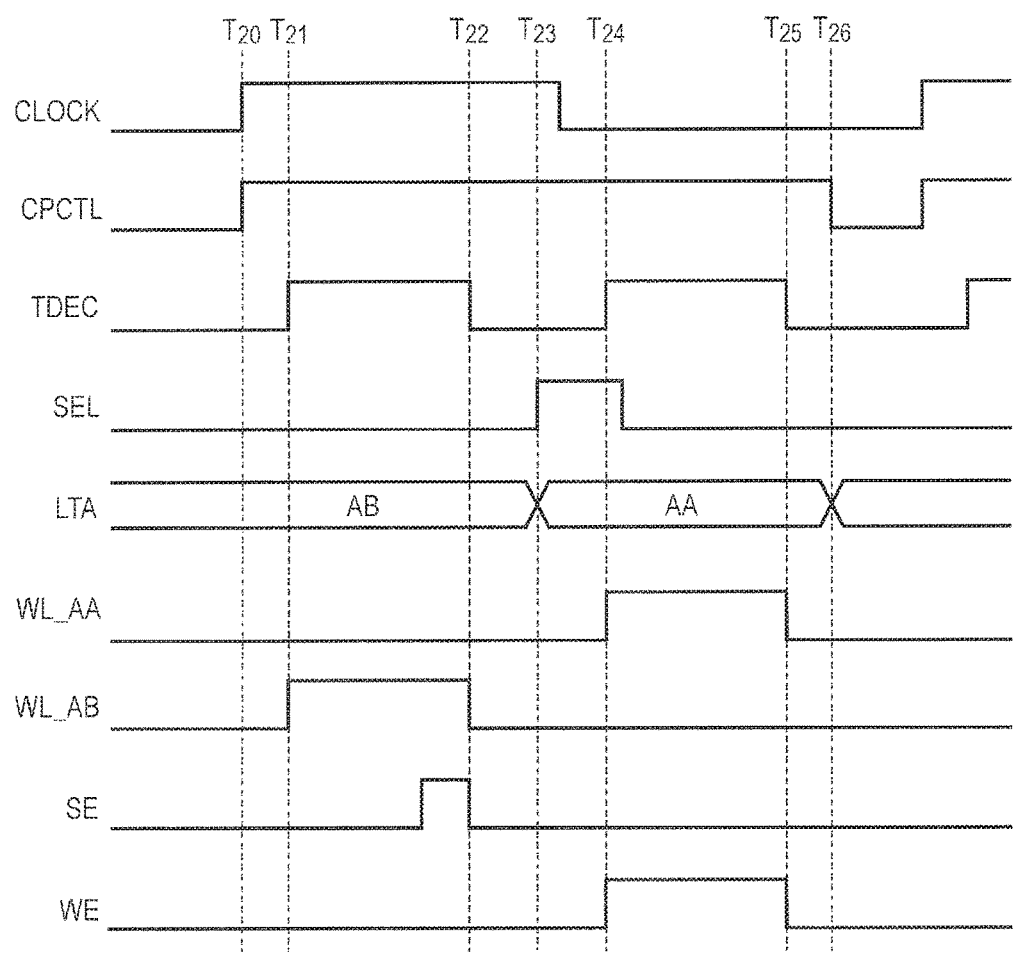
FIG. 7 is a timing chart showing the operation of the address control circuit shown in FIG. 6 as well as the operation of a control circuit.

FIG. 7 is a timing chart showing the operation of the address control circuit 10 shown in FIG. 6 as well as the operation of the control circuit 11. In the example shown in FIG. 7, the A port is the port for writing and the B port is the port for reading. The write operation is performed after the read operation.

The clock signal CLK rises at time T20. Along with this, the address latch control signal CPCTL is activated, and the address signals AA and AB are respectively latched in the address latch circuits 1 and 2.

At time T21, the first time start signal TDEC is set to "High" level. At this time, the selection signal SEL is at "Low" level, so that the transfer circuit 3 is closed. Thus, the address signal AB on the B port side is output to the internal address signal LTA. In this way, the decode circuit 4 selects the word line WL_AB corresponding to the address indicated by the address signal AB. The word line driving circuit 5 drives (activates) the selected word line WL_AB in synchronization with the start signal TDEC. The control circuit 11 activates a sense enable signal SE near the end of the period during which the word line WL_AB is driven. In this way, the sense amplifier 16 can read the data from the target memory cell at the timing when the amount of charge accumulated in the bit line is greatest.

At time T22, the word line WL_AB is inactivated when the first time start signal TDEC is reset.

At time T23, the selection signal SEL is changed to "High" level. In response to this transition, the transfer circuit 3 supplies the address signal AA on the A port side to the address latch circuit 1. Thus, the address signal AA on the A port side is output to the internal address signal LTA. In response to this, the decode circuit 4 selects the word line WL_AA corresponding to the address signal AA. Further, once the address signal AA on the A port side is transferred to the address latch circuit 1, the selection signal SEL may transition to "Low" level.

At time T24, the second time start signal TDEC is set to "High" level. In response to this, the word line driving circuit 5 drives the selected word line WL_AA in synchronization with the start signal TDEC. The control circuit 11 activates the write enable signal WE in synchronization with the period during which the word line WL_AA is driven. In this way, the write driving circuit 15 outputs the write data for the B port, which is held in the input/output buffer 17, to the column selection circuit 14. The column selection circuit 14 writes the write data for the B port into the target memory cell by driving a pair of bit lines according to the selection control signal of the column input from the decode circuit 4.

At time T25, the word line WL_AA is inactivated when the second time start signal TDEC is reset.

At time T26, the address latch control signal CPCTL is inactivated, and the address latch circuits 1 and 2 return to a through state.

According to the above description, the memory unit 20 can perform the read and write operations, in response to the two start signals TDEC generated by the internal clock pulse generator circuit 400, during one cycle of the clock signal CLK.

Second Embodiment

In the above embodiment, the description has been made on the configuration and operation of the internal clock pulse generator circuit 400 for generating the start signal TDEC twice during one cycle of the clock signal CLK in the memory unit 20 having two ports (A port and B port). Incidentally, in terms of reducing the clock frequency of the clock signal CLK, a memory unit having N (N is an integer of three or more) ports preferably generates the start signal TDEC N times during one cycle of the clock signal CLK. Thus, an internal clock pulse generator circuit 800 for generating the start signal TDEC three times during one cycle of the clock signal CLK will be described below as an example.

Figure 8:
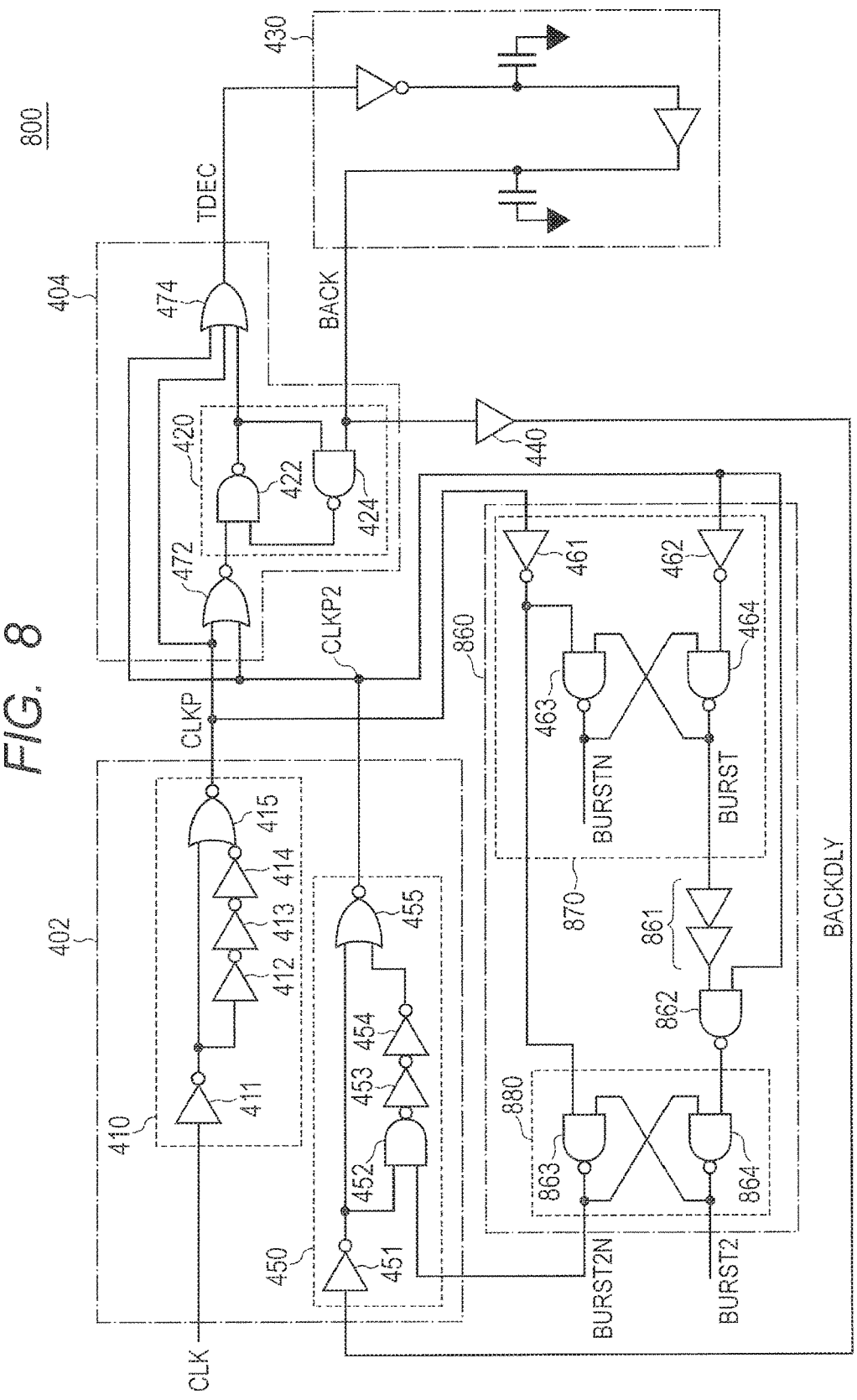
FIG. 8 is a diagram showing a configuration example of an internal clock pulse generator circuit.

FIG. 8 is a diagram showing a configuration example of the internal clock pulse generator circuit 800. Note that the same parts are designated by the same reference numerals and the description thereof will not be repeated.

The internal clock pulse generator circuit 800 is different from the internal clock pulse generator circuit 400 described with reference to FIG. 4 in that the internal clock pulse generator circuit 800 is provide with a second latch circuit 860 in place of the second latch circuit 460.

The second latch circuit 860 includes a first flip-flop 870 and a second flip-flop 880. The second flip-flop 880 is provided in the subsequent stage of the first flip-flop 870 in the transmission path of the signal in the internal clock pulse generator circuit 800.

The first flip-flop 870 is a reset/set type flip-flop configured with two inverters 461 and 462 as well as two NAND gates 463 and 464. The second flip-flop 880 is a reset/set type flip-flop configured with two NAND gates 863 and 864. In this way, in an aspect, the internal clock pulse generator circuit has flip-flops corresponding to the number of times the start signal TDEC is generated during one cycle of the clock signal CLK.

The second latch circuit 860 further includes an adjustment delay circuit 861 and a NAND gate 862, which are provided between the first flip-flop 870 and the second flip-flop 880. The adjustment delay circuit 861 delays the output signal BURST of the first flip-flop 870 and inputs the delayed signal BURST to an end of the NAND gate 862. The second pulse signal is input to the other end of the NAND gate 862.

A control signal BURST2N output from the second latch circuit 860 is input to an end of the NAND gate 451 configuring the second pulse signal generator circuit 450. The output signal BURST2N is also the output signal of the second flip-flop 880.

Figure 9:
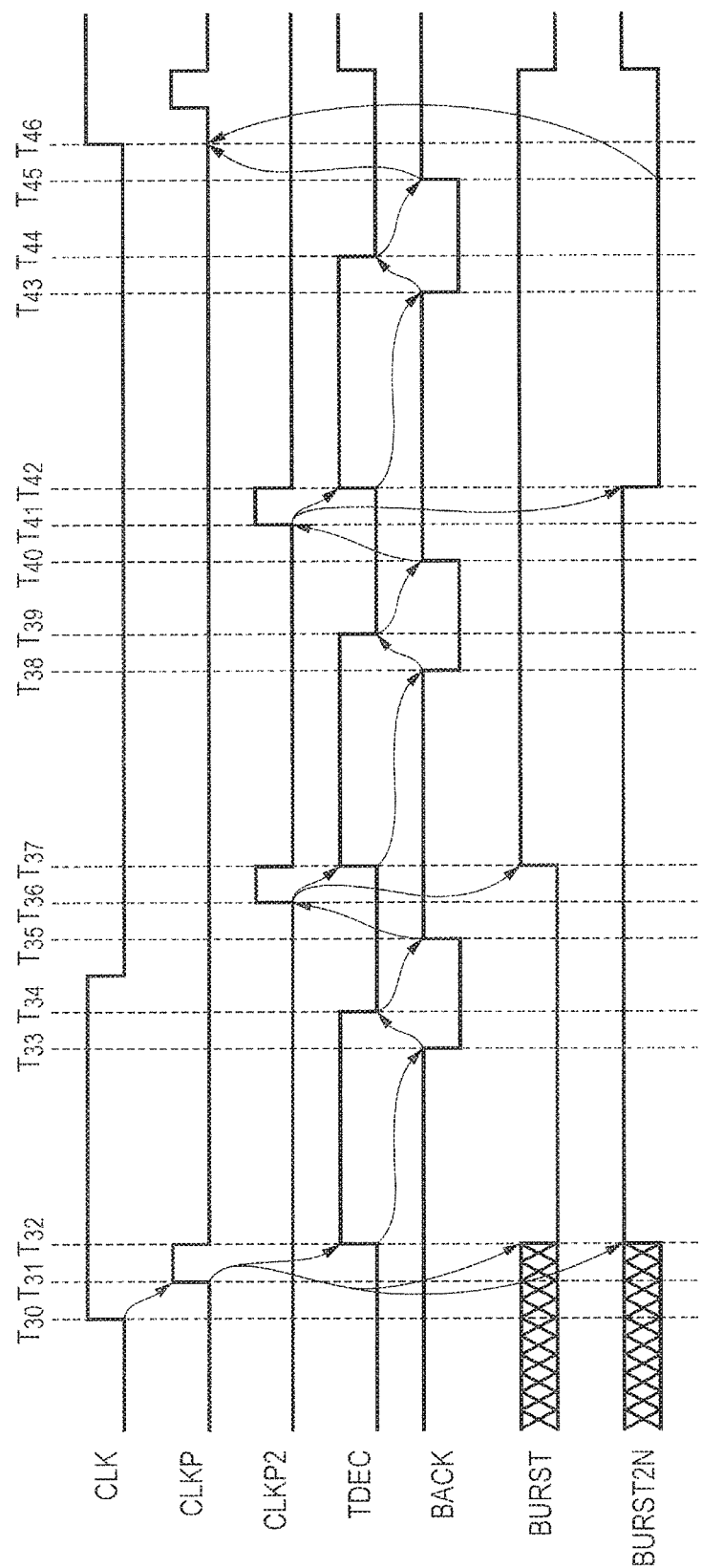
FIG. 9 is a timing chart showing the operation of the respective circuits included in the internal clock pulse generator circuit shown in FIG. 8.

FIG. 9 is a timing chart showing the operation of the respective circuits included in the internal clock pulse generator circuit 800 according to an embodiment. Note that the process from time T30 to T41 shown in FIG. 9 is similar to the process from time T0 to T11 described with reference to FIG. 4, so that only differences are described here.

At time T32, in response to the input of the first pulse signal CLKP, the second latch circuit 860 sets the control signal BURST2N to be output to the second pulse signal generator circuit 450, to "High" level and holds this state. At this time, the output signal BURST of the first flip-flop 870 transitions to "Low" level.

During the period of time T36 to T37, the first time second pulse signal CLKP2 is generated. At this time, the first time second pulse signal CLKP2 (signal of "High" level") is input to an end of the NAND gate 862. Then, the output signal BURST of "Low" level is input to the other end of the NAND gate 862 by the operation of the adjustment delay circuit 861. Thus, the NAND gate 862 outputs a signal of "High" level to the NAND gate 864 configuring the second flip-flop 880, even when the first time second pulse signal CLKP2 is generated. For this reason, the second latch circuit 860 keeps the control signal BURST2N being set even when the first time second pulse signal CLKP2 is input.

At time T40, the feedback signal BACK transitions to "High" level. At this time, the second pulse signal generator circuit 450 accepts the input of the control signal BURST2N that is set to "High" level. Thus, the second pulse signal generator circuit 450 generates the second time second pulse signal CLKP2 at T41 in response to the transition of the feedback signal BACK to "High" level.

At time T42, following the input of the second time second pulse signal CLKP2, the second latch circuit 860 resets the control signal BURST2N to be output to the second pulse signal generator circuit 450. More specifically, the second time second pulse signal CLKP2 ("High" level) is input to an end of the NAND gate 862 that configures the second latch circuit 860. Then, the output signal BURST of "High" level is input to the other end of the NAND gate 862, so that the NAND gate 862 outputs a signal of "Low" level.

In this way, the control signal BURST2N to be output to the second flip-flop 880 is reset to "Low" level.

As described above, the second latch circuit 860 is configured to reset the control signal BURST2N by inputting the second pulse signal CLKP2 twice.

The behavior of the start signal TDEC and the feedback signal BACK during the period of time T42 to T45 is the same as the behavior of the start signal TDEC and the feedback signal BACK during the period of time T2 to T5 described with reference to FIG. 5. Thus, the description thereof will not be repeated.

At time T46, in response to the transition of the feedback signal BACK to "High" level, the second pulse signal generator circuit 450 does not generate the second pulse signal CLKP2. The reason of this is that the control signal BURST2N is reset to "low" level. More specifically, in a state of accepting the input of the reset control signal BURST2N, the NAND gate 452 constantly outputs a signal of "High" level. Thus, in a state where the control signal BURST2N is reset, a signal of "High" level is constantly input to an end of the NOR gate 455 through the inverter 454. In this case, the NOR gate 455 does not generate the second pulse signal CLKP2 regardless of the level of the delayed feedback signal BACKDLY.

According to the above description, the internal clock pulse generator circuit 800 can generate the start signal TDEC three times during one cycle of the clock signal CLK.

Further, the second latch circuit 860 is configured to have flip-flops corresponding to the number of times the internal clock pulse generator circuit 800 generates the start signal TDEC (for example, the number obtained by subtracting 1 from the number of times the start signal TDEC is generated). By the operation of second latch circuit 860, the pulse signal generation unit 402 does not generate a fourth time pulse signal (third time second pulse signal CLKP2) in one cycle of the clock signal CLK. In this way, the internal cock generator circuit 800 can prevent unwanted operation that performs again the operation corresponding to three ports that has been already performed. As a result, the memory unit including the internal clock pulse generator circuit 800 can reduce the power consumption for performing unwanted operation.

Note that although the foregoing has described the case of generating the start signal TDEC three times as an example, it is also possible to configure the internal clock pulse generator circuit to generate the start signal TDEC four or more times by increasing the number of flip-flops that configure the second latch circuit.

Third Embodiment

In the embodiment described above, the memory cell MC configuring the memory unit is a single-port SRAM cell, in which the memory unit operates as a pseudo multi-port memory by performing the operation a plurality of times during one cycle of the clock signal CLK in response to the start signal TDEC. This is a technique that allows the physical one-port memory to function as a pseudo multi-port memory. Thus, the use of this technique in a physical multi-port memory allows each physical port to be artificially treated as multiple ports.

Figure 10:
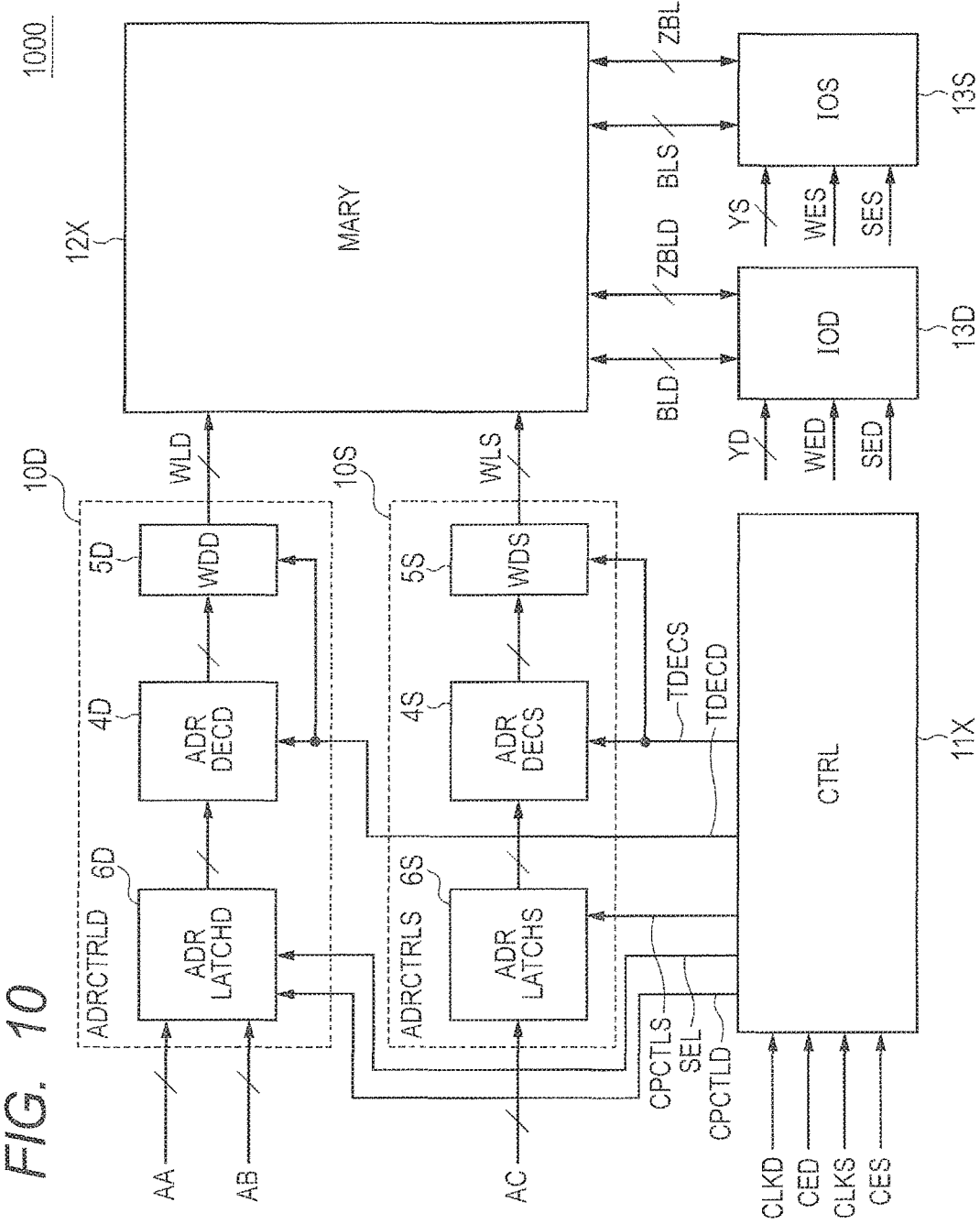
FIG. 10 is a block diagram showing a configuration example of a multi-port memory including two pseudo ports.

FIG. 10 is a block diagram showing a configuration example of a multi-port memory 1000 including pseudo two ports. Note that the same parts are designated by the same reference numerals and the description thereof will not be repeated.

The multi-port memory 1000 includes a two-port memory array 12X, address control circuit 10D (ADRCTRLD) and 10S (ADRCTRLS), data input/output circuits 13D (IOD) and 13S (IOS), and a control circuit (CTRL) 11X.

The memory array 12X has a physical two-port signal transmission path. In an aspect, word lines WLD and WLS as well as bit line pairs BLS/ZBLS and BLD/ZBLD are coupled to each of a plurality of memory cells that configure the memory array 12X. Note that in the example shown in FIG. 10, each of the word lines WLD and WLS is represented by only one line, and similarly each bit line pairs BLS/ZBLS and BLD/ZBLD is represented by only one pair of bit lines. However, actually, different two word lines and different two bit line pairs are coupled to each memory cell.

In an embodiment, the word line WLD and the bit line pair BLD/ZBLD are respectively configured to transmit pseudo two-port data. On the other hand, the word line WLS and the bit line pair BLS/ZBLS are respectively configured to transmit single-port data.

The address control circuit 10D is coupled to the word line WLD, and the data input/output circuit 13D is coupled to the bit line pair BLD/ZBLD. The address control circuit 10S is coupled to the word line WLS, and the data input/output circuit 13S is coupled to the bit line pair BLS/ZBLS.

The address signals AA and AB, the clock signal CLKD, and the chip enable signal CED (including CENA and CENB) are input to the address control circuit 10D. On the other hand, the address signal AC, the clock signal CLKS, and the chip enable signal CES are input to the address control circuit 10S.

The address control circuit 10D has the same configuration as the address control circuit 10 shown in FIGS. 1 and 6. The address control circuit 10D is provided with a latch circuit (ADRLATCHD) 6D, a decode circuit (ADRDECD) 4D, and a word line driving circuit (WDD) 5D. The data input/output circuit 13D is similar to the data input/output circuit 13 shown in FIG. 1. The control circuit 11X generates various control signals CPCTLD, SELD, TDECD, CPAD, WED, SED, and the like, based on the input clock signal CLKD and on the input chip enable signal CED. Then, the control circuit 11X supplies the generated control signals to the address control circuit 10D and the data input/output circuit 13D.

The address control circuit 10S has the same configuration as the general address control circuit for single-port memory. The address control circuit 10S is provided with a latch circuit (ADRLATCHS) 6S, a decode circuit (ADRDECS) 4S, and a word line driving circuit (WDS) 5S. The address control circuit 10S drives the word line WLS corresponding to the input address signal AC. The data input/output circuit 13S has the same configuration as the general data input/output circuit for single-port memory. The control circuit 11X generates various control signals CPCTLS, TDECS, CPAS, WES, SES, and the like, based on the input clock signal CLKS and on the input chip enable signal CES. Then, the control circuit 11X supplies the generated control signals to the address control circuit 10S and the data input/output circuit 13S.

In this way, the memory unit 1000 includes the circuit for handling the pseudo two-port data and the circuit for handling the single-port data independently of each other. For this reason, the memory unit 1000 can perform the operation for handling data of two physical ports without synchronization.

Note that in the example described above, the memory unit has the configuration to treat only one of the two physical ports as pseudo two ports. However, in another aspect, the memory unit can also be configured to treat both ports as multiple ports. Further, the same may hold true for a multi-port memory with three or more ports.

The memory cell configuring the memory array 12X can be achieved by various multi-port memory cells. The configuration of the multi-port memory cell will be described with reference to FIGS. 11 and 12.

Figure 11:
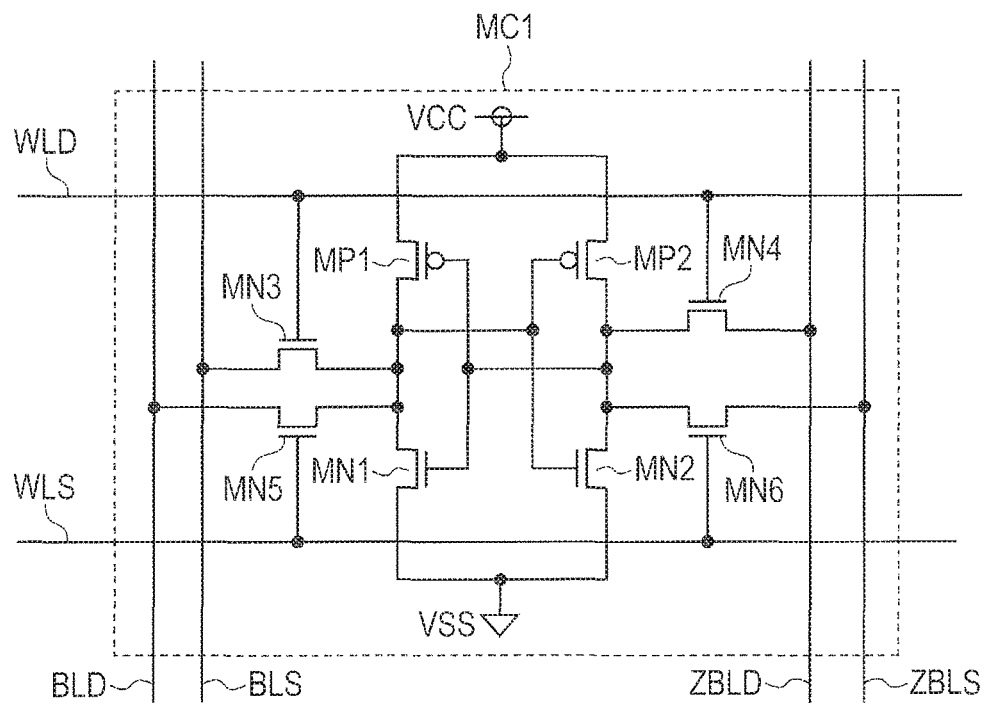
FIG. 11 is a circuit diagram showing a configuration example of a dual port SRAM memory cell.

FIG. 11 is a circuit diagram showing a configuration example of a dual port SRAM memory cell. As compared with the single-port memory cell MC shown in FIG. 2, the memory cell MC1 shown in FIG. 11 further includes two N-channel MOS transistors MN5 and MN6. The word line WLD and the bit line pair BLD/ZBLD are coupled to the N-channel MOS transistors MN3 and MN4 to transmit pseudo two-port data. The word line WLS and the bit line pair BLS/ZBLS are coupled to the N-channel MOS transistors MN5 and MN6 to transmit single-port data. The two ports are independent of each other, so that data can be read and written without synchronization. However, when write operations on the same memory cell compete with each other or when write and read operations compete with each other, it is necessary to adjust by known techniques.

Figure 12:
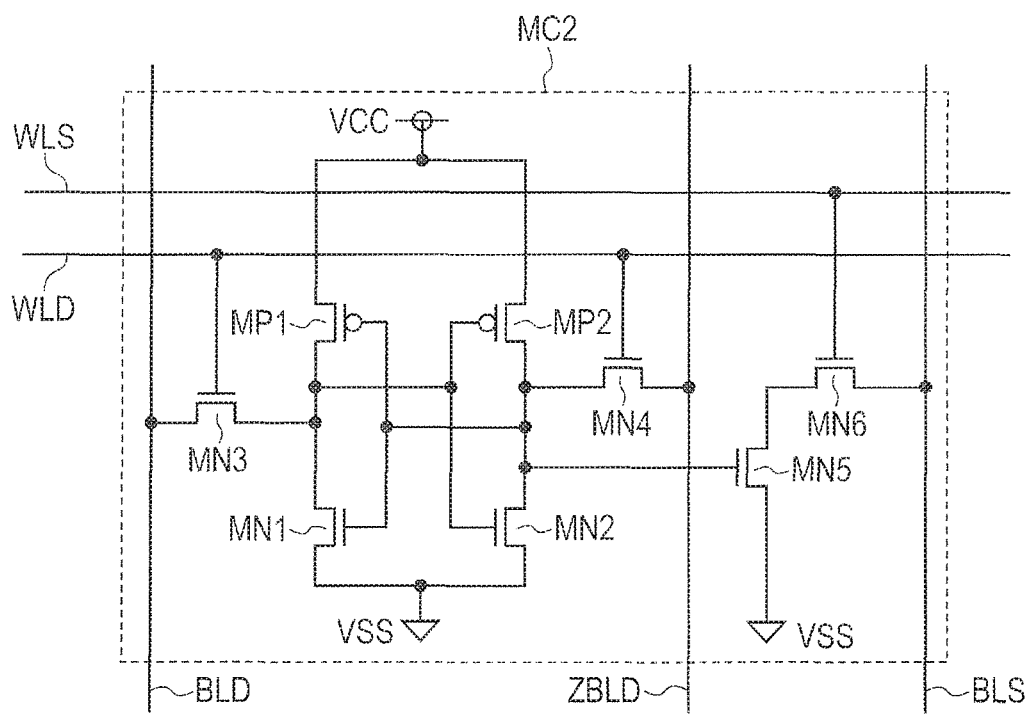
FIG. 12 is a circuit diagram showing a configuration example of another dual port SRAM memory cell.

FIG. 12 is a circuit diagram showing a configuration example of another dual port SRAM memory cell. As compared with the single-port memory cell MC shown in FIG. 2, the memory cell MC2 shown in FIG. 12 is further includes two N-channel MOS transistors MN5 and MN6. The word line WLD and the bit line pair BLD/ZBLD are coupled to the N-channel MOS transistors MN3 and MN4 to transmit pseudo two-port data. The gate of the N-channel MOS transistor MN5 is coupled to the input of the CMOS inverter circuit that is configured with the transistors MN2 and MP2. The gate of the N-channel MOS transistor MN6 is coupled to the word line WLS. The source of the N-channel MOS transistor MN6 as well as one of the drains are coupled to the bit line BLS. The source of the N-channel MOS transistor MN6 as well as the other drain are coupled to the drain of the N-channel MOS transistor MN5. In the example shown in FIG. 12, the port corresponding to the word line WLS and the bit line BLS can be a read-only port. Note that, in this case, the data input/output circuit 13S should also be changed accordingly.

According to the above description, even when the physical multi-port memory is used, each of the physical ports can be treated as pseudo multiple ports. In this way, it is possible to expand the number of ports of the multi-port memory to a large number of ports.

Fourth Embodiment

The pseudo two-port SRAM (A port is write port and B port is read port) has been described as a configuration example. However, of course, it is also possible to achieve a pseudo dual port SRAM in which each of the two ports functions as write and read port. The configuration of the sense amplifier for this case is described below.

Figure 13:
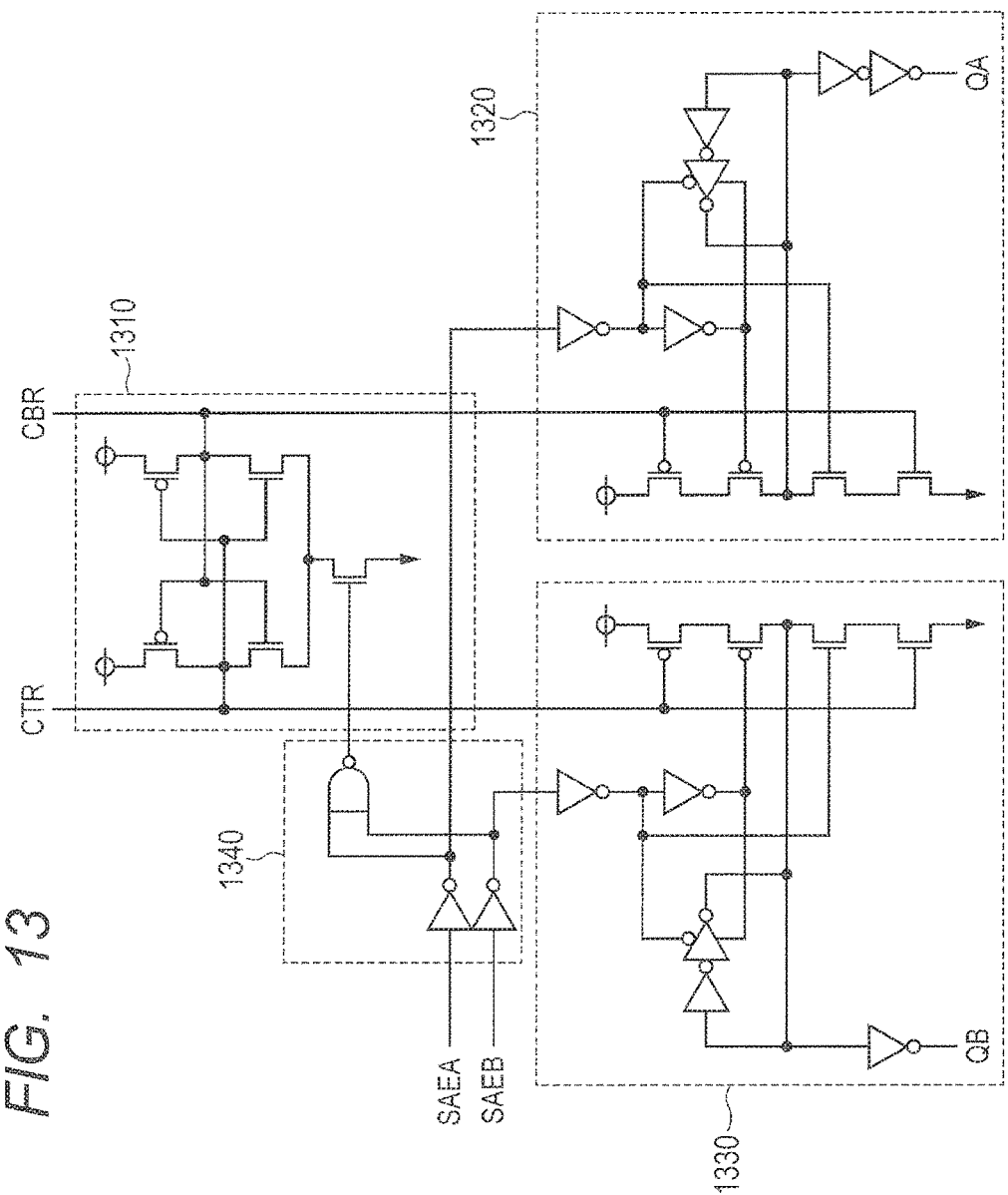
FIG. 13 is a circuit diagram showing a configuration example of a sense amplifier of a pseudo dual port SARAM.

FIG. 13 is a configuration example of the sense amplifier of the pseudo dual port SRAM. The sense amplifier 16 is configured with a cross-coupled circuit 1310 for data amplification, a data latch circuit 1320 for A port, a data latch circuit 1330 for B port, and a sense enable signal control circuit 1340.

The potential difference between common bit lines CTR and CBR is amplified by the cross-coupled circuit 1310. Then, the read data is stored in the data latch circuits 1320 and 1330, respectively.

For example, when the first time start signal TDEC is activated, the sense enable signal SAEA on the A port side is activated. Then, the data is stored in the data latch circuit 1320 for A port and is output to QA. Next, when the second time start signal TDEC is activated, the sense enable signal SAEB on the B port side is activated. Then, the data is stored in the data latch circuit 1330 for B port and is output to QB.

According to the above description, the sense amplifier 16 sequentially performs a read operation, in response to two start signals TDEC generated by the internal clock pulse generator circuit 400, during one cycle of the clock signal CLK.

While the invention made by the present inventors has been concretely described based on the embodiments, the present invention is not limited to the exemplary embodiments. It is apparent to those skilled in the art that various modifications and variations can be made without departing from the scope of the present invention.

For example, the difference in use of the positive and negative logic of each signal line or circuit as well as the circuit configuration shown in the specification and drawings are merely an example, which can be arbitrarily changed to another signal or circuit that achieves the same function.

Configuration (Configuration 1)

A multi-port memory (20) according to an embodiment includes: a memory array (12) including a plurality of memory cells and a plurality of words lines; a control circuit (400) for generating a start signal based on an input clock signal; an address control circuit (10) including a plurality of ports to activate one of the word lines by decoding one of a plurality of address signals input from the ports at the timing corresponding to the start signal; and a data input/output circuit (13) for writing or reading data by selecting one of the memory cells coupled to the activated word line, based on an output from the address control circuit. The control circuit includes: a pulse signal generation unit (401) that generates a pulse signal; a start signal generation unit (404) that generates a start signal in response to an output of the pulse signal generation unit; and a delay circuit (430) that generates a delay signal to delay the start signal. The pulse signal generation unit includes a first pulse signal generator circuit (410) that generates a first pulse signal (CLKP) in response to the input of the clock signal. The start signal generation unit includes a first latch circuit (420) that sets a first start signal (a first time TDEC) to a first state and holds this state in response to generation of the first pulse signal, and then resets the first start signal to a second state in response to a first delayed signal (BACK) obtained by delaying the first start signal by the delay circuit. The pulse signal generation unit further includes a second pulse signal generator circuit (450) that generates a second pulse signal (CLKP2) in response to the input of the first delayed signal. The first latch circuit sets a second start signal (a second time TDEC) to the first state and holds this state in response to generation of the second pulse signal, and then resets the second start signal in response to a second delayed signal obtained by delaying the second start signal by the delay circuit.

With this configuration, the multi-port memory can generate the start signal (internal clock) two or more times, during one cycle of the clock signal, by using only one of the rising and falling edges of the clock signal. In this way, the multi-port memory can perform the next operation immediately after the completion of an operation (writing or reading). As a result, the multi-port memory can increase the operation frequency to a level higher than the conventional level.

(Configuration 2)

In (Configuration 1), the control circuit further includes a second latch circuit (460) that sets the control signal to a third state and holds this state in response to the first pulse signal, and then resets the control signal to a fourth state in response to the second pulse signal. In a state of accepting the input of the control signal that is set to the third state, the second pulse signal generator circuit is configured to further generate the second pulse signal in response to the input of the second delayed signal.

With this configuration, the multi-port memory can generate the start signal the intended number of times, during one cycle of the clock signal. Thus, the multi-port memory can reduce the power consumption by preventing unwanted operation that performs again the operation already performed.

(Configuration 3)

In (Configuration 2), the second latch circuit resets the control signal to the fourth state by inputting the second pulse signal a predetermined number of times. The second latch circuit has flip-flops corresponding to the predetermined number of times.

(Configuration 4)

In (Configuration 3), the predetermined number of times is two or more. The second latch circuit includes a first flip-flop (870), a second flip-flop (880) provided in the subsequent stage of the first flip-flop (870) in the signal transmission path in the control circuit, and an adjustment delay circuit (861) provided between the first and second flip-flops, to delay the output of the first flip-flop and input to the second flip-flop.

(Configuration 5)

In (Configuration 1), the memory cell is coupled to first and second word lines. The address control circuit is a first address control circuit (10D). The first address control circuit is configured to activate the first word line (WLD) at the timing corresponding to the start signal. The memory cell further includes a second address control circuit (10S) including at least one port, to activate the second word line (WLS) by decoding one of the address signals input from at least one port.

(Configuration 6)

In (Configuration 1), the address control circuit (10) is configured to include at least first and second ports, in such a way that a first address signal (AA) is input from the first port and a second address signal (AB) is input from the secondport. The address control circuit (10) includes: a first address latch circuit (1) for latching the first address signal; a second address latch circuit (2) for latching the second address signal; a selection circuit (3) for selecting either the first address signal output from the first address latch circuit or the second address signal output from the second address latch circuit, and outputting the selected address signal; a decode circuit (4) for selecting one of the word lines by decoding the signal selected by the selection circuit; and a word line driving circuit (5) for activating the word line selected by the decode circuit.

What is claimed is:

1. A memory circuit comprising:
   a memory array including a plurality of memory cells and a plurality of word lines coupled to the memory cells;
   a control circuit receiving an input clock signal and generating first and second start signals within a single signal cycle of the input clock signal;

an address control circuit coupled to a plurality of address ports for receiving a plurality of address signals and activating one of the word lines corresponding to one of the address signals based on the first or second start signals; and a data input/output circuit for writing or reading data by selecting one of the memory cells coupled to the activated word line, wherein the control circuit includes:

a start signal generation unit that generates the first start signal in response to a first pulse signal and the second start signal in response to a second pulse signal, and a pulse signal generation unit that generates the first pulse signal in response to the input clock signal and the second pulse signal in response to the first start signal.

2. The memory circuit according to claim 1, wherein the pulse signal generation unit includes a first pulse signal generator circuit that generates the first pulse signal in response to the clock signal, wherein the start signal generation unit includes a first latch circuit that sets the first start signal to a first state and holds this state in response to the first pulse signal, and then resets the first start signal to a second state in response to a first delayed signal that is obtained by delaying the first start signal by a delay circuit, wherein the pulse signal generation unit further includes a second pulse signal generator circuit that generates the second pulse signal in response to the first delayed signal, and wherein the first latch circuit sets the second start signal to the first state and holds this state in response to generation of the second pulse signal, and then resets the second start signal to the second state in response to a second delayed signal obtained by delaying the second start signal by the delay circuit.

3. The memory circuit according to claim 2, wherein the control circuit further includes a second latch circuit that sets a control signal to a third state and holds this state in response to the first pulse signal, and then resets the control signal to a fourth state in response to the second pulse signal, and wherein, in a state of accepting the input of the control signal that is set to the third state, the second pulse signal generator circuit is configured to further generate the second pulse signal in response to the second delayed signal.

4. The memory circuit according to claim 3, wherein the second latch circuit resets the control signal to the fourth state by inputting the second pulse signal a predetermined number of times, and wherein the second latch circuit includes flip-flops corresponding to the predetermined number of times.

5. The memory circuit according to claim 4, wherein the predetermined number of times is two or more, and wherein the second latch circuit comprises:

a first flip-flop;

a second flip-flop provided in a subsequent stage of the first flip-flop in a signal transmission path in the control circuit; and an adjustment delay circuit provided between the first flip flop and the second flip-flop, to delay an output of the first flip-flop and input to the second flip-flop.

6. The memory circuit according to claim 1, wherein the address control circuit is configured to include at least first and second ports in such a way that a first address signal is input from the first port and a second address signal is input from the second port, wherein the address control circuit comprises:

a first address latch circuit for latching the first address signal which is input from a first port of the address ports;

a second address latch circuit for latching the second address signal which is input from a second port of the address ports;

a selection circuit for selecting either the first address signal output by the first address latch circuit or the second address signal output by the second address latch circuit, and outputting the selected address signal;

a decode circuit for selecting one of the word lines by decoding the selected address signal; and a word line driving circuit for activating one of the word lines selected by the decode circuit based on the first or second start signals.

7. The memory circuit according to claim 1, wherein the control circuit generates the first and second start signals within the single signal cycle of the input clock signal according to the start signal generation unit, the pulse signal generation unit and the input clock signal.

8. The memory circuit according to claim 1, wherein the control circuit generates the first and second start signals within the single signal cycle of the input clock signal with dependence on the input clock signal.

* * * * *